United States Patent [19]
Watt et al.

[11] Patent Number: 5,751,507
[45] Date of Patent: May 12, 1998

[54] KSD PROTECTION APPARATUS HAVING FLOATING EDS BUS AND SEMICONDUCTOR STRUCTURE

[75] Inventors: Jeffrey Watt, Mountain View; Andrew Walker, Palo Alto, both of Calif.

[73] Assignee: Cypress Semiconductor Corporation, San Jose, Calif.

[21] Appl. No.: 515,433

[22] Filed: Aug. 15, 1995

[51] Int. Cl.$^6$ ............................................. H02H 9/00
[52] U.S. Cl. ........................... 361/56; 361/111; 361/118
[58] Field of Search ............................ 361/56, 91, 111, 361/118, 127

[56] References Cited

U.S. PATENT DOCUMENTS

| | | | |
|---|---|---|---|
| 4,990,802 | 2/1991 | Smooha | 307/482 |
| 5,019,888 | 5/1991 | Scott et al. | 357/41 |
| 5,043,782 | 8/1991 | Avery | 357/23.13 |
| 5,140,401 | 8/1992 | Ker et al. | 357/43 |
| 5,182,220 | 1/1993 | Ker et al. | 437/34 |
| 5,218,222 | 6/1993 | Roberts | 257/362 |
| 5,289,334 | 2/1994 | Ker et al. | 361/56 |
| 5,311,391 | 5/1994 | Dungan | 361/56 |
| 5,329,143 | 7/1994 | Chan et al. | 257/173 |

OTHER PUBLICATIONS

IEEE/IRPS (1987); ESD Phenomena and Protection Issues in CMOS Output Buffers; Duvvury, et al.; pp. 174–180.

IEEE Transactions on Electron Devices, vol. 35, No. 12, Dec. 1988; Internal Chip ESD Phenomena Beyond the Protection Circuit; Duvvury, et al.; pp. 2133–2138.

EOS/ESD Symposium Proceedings (1989); "Improving the ESD Failure Threshold of Silicided nMOS output Transistors by Ensuring Uniform Current Flow"; Polgreen, et al.; pp. 168–174.

IEEE Electron Device Letters, vol. 12, No. 1; Jan. 1991; "A Low–Voltage Triggering SCR for On–Chip ESD Protection at Output and Input Pads"; Chatterjee; pp. 21–22.

IEEE (1992); "Achieving Uniform nMOS Device Power Distribution for Sub–Micron ESD Reliability"; Duvvury, et al.; pp. 92–131–92–134.

EOS/ESD Symposium; "ESD Protection in a Mixed Voltage Interface and Multi–Rail Disconnected Power Grid Environment in 0.50–and 0.25–mu m Channel Length CMOS Technologies"; Voldman; pp. 91–125–91–134.

EOS/ESD Symposium; "Core Clamps for Low Voltage Technologies"; Dabral, et al.; pp. 94–141–94–149.

IEEE (1994); "Mixed–Voltage Interface ESD Protection Circuits for Advanced Microprocessors in Shallow Trench and LOCOS Isolation CMOS Technologies"; Voldman, et al.; pp. 94–141–94–149.

EOS/ESD Symposium Proceeding (1990); "Electrostatic Discharge Protection In A 4–MBIT DRAM"; Jaffe, et al.; IBM General Technology Division; pp. 1–6.

IEEE/IRPS (1991); "Proximity Effects of Unused Output Buffers on ESD Performance"; LeBlanc, et al.; Texas Instruments Inc., pp. 327–330.

*Primary Examiner*—Jeffrey A. Gaffin
*Assistant Examiner*—Stephen Jackson
*Attorney, Agent, or Firm*—Dykema Gossett PLLC

[57] ABSTRACT

An apparatus for protecting an integrated circuit against damage from electrostatic discharges (ESD) includes a single ESD bus that is connected to multiple input pads through a respective diode. The ESD bus is isolated from the positive power supply bus $V_{DD}$. The ESD bus is coupled to the negative power supply bus $V_{SS}$ by a FET-triggered SCR circuit. ESD charge on an input pad forward biases the respective diode and charges the ESD bus. When the voltage of the ESD bus reaches a predetermined threshold voltage, the FET breaks down, and triggers the SCR circuit to shunt the charge on the ESD bus to $V_{SS}$. The threshold voltage is selected such that, in normal operation, voltages higher than $V_{DD}$ may be applied to the input pad without input leakage current.

13 Claims, 2 Drawing Sheets

5,751,507

1

KSD PROTECTION APPARATUS HAVING FLOATING EDS BUS AND SEMICONDUCTOR STRUCTURE

BACKGROUND OF THE INVENTION

1. Field of the Invention

The present invention relates generally to protection devices, and, more particularly, to protection devices for protecting integrated circuits from various electrical transients, including electrostatic discharge (ESD).

2. Description of the Related Art

As very large scale integration (VLSI) circuit geometries continue to shrink, the decrease in the corresponding gate oxide thicknesses, relative to breakdown voltage, have resulted in the device's greater susceptibility to damage from application of excessive voltages, for example, by an electrostatic discharge (ESD) event. In particular, during an ESD event, charge is transferred between one or more pins of the integrated circuit and another conducting object in a time period that is typically less than one microsecond. As indicated above, this charge transfer can generate voltages that are large enough to break down insulating films (e.g., gate oxides) on the device or can dissipate sufficient energy to cause electrothermal failures in the device. Such failures include contact spiking, silicon melting, or metal interconnect melting.

Accordingly, many attempts have been made in the prior art to protect semiconductor devices, with particular attention to the problem of protecting field effect devices from such ESD events. FIG. 1 is representative of a common approach taken in the prior art to protect integrated circuit devices. An input protection scheme indicated generally at 10, for protecting an input buffer 12 from ESD events occurring at input pad 14 includes a primary ESD protection circuit 16, a secondary ESD protection circuit 18, and a core clamp 20 for providing power supply ESD protection. Protection circuits, such as 10, are usually connected to all I/O pads of an integrated circuit to safely dissipate the energy associated with ESD events without causing any damage to internal circuitry, such as input buffer 12, that is connected to I/O pad 14. The double diode primary ESD circuit 16 includes diodes $D_1$, and $D_2$ and is connected between a positive power supply bus $V_{DD}$ and a negative power supply bus $V_{ss}$, with the input pad 14 being connected at a node common to the diodes. The primary ESD circuit 16 carries the majority of the charge during an ESD event. In particular, diode $D_1$ shunts ESD charge to the $V_{ss}$ bus when the polarity is negative, while diode $D_2$ shunts ESD charge to the $V_{DD}$ bus when the polarity is positive. Secondary ESD protection circuit 18 includes a resistor R in series with a grounded gate FET clamp $M_O$, which is operative to limit the voltage across the gate oxides of input buffer 12. The amount of charge that flows through secondary ESD protection circuit 18 is relatively small in comparison to the amount of charge flowing through primary ESD protection circuit 16. Core clamp 20 permits charge to be transferred between the power supply busses during an ESD event.

Although protection circuitry 10 provides satisfactory performance relative to ESD events on input pins, the performance of circuitry 10 does not meet state-of-the-art standards for so-called input "leakage" currents in certain applications. In particular, contemporary VLSI circuit designs provide for instances where the input pins on the integrated circuit are subjected to voltages which exceed the positive power supply voltage of the integrated circuit. For example, particular integrated circuits may provide for

2 operation in a mixed-voltage environment where the integrated circuit may operate at one voltage level (e.g., $V_{DD}$= 3.3 volts), but must interface with another integrated circuit operating at a different, higher, power supply voltage (e.g., 5.0 volts). As another example, input pins on a programmable integrated circuit, particularly those pins associated with programming of the device, may need to tolerate voltages well above the power supply voltage to effect programming due to various and well known solid state mechanisms that require such high voltage (e.g., hot carrier injection, tunneling, and dielectric breakdown). Moreover, other integrated circuits may provide for an additional logic level by using a voltage level above the power supply voltage level, as may be required to control special test modes for product characterization, control programming, or other functions that are not part of normal operation.

Referring again to FIG. 1, it should be appreciated that when the input voltage applied to input pad 14 exceeds the positive power supply $V_{DD}$ by more than the forward-biased diode voltage drop of about 0.7 volts, diode $D_2$ will begin to conduct. Particularly, when the input pad is at 5 volts, and the positive power supply voltage $V_{DD}$ is at 3.3 volts, the voltage drop across diode $D_2$ will cause $D_2$ to become strongly forward-biased, resulting in an excessive level of input current—the so-called input "leakage" current. This condition is undesirable, and, in many applications, commercially unacceptable. It should be understood that secondary ESD protection circuit 18 neither clamps the input voltage, nor carries any appreciable leakage current when input voltages on input pad 14 rise above $V_{DD}$ during normal operation. Thus, an acceptable solution to this problems lies in addressing the primary ESD protection circuit 16.

One approach taken in the art in remedying the above-identified leakage current problem uses a grounded gate FET as the primary ESD protection. The grounded gate FET is a field effect transistor having its drain terminal connected to the input pad, while its gate and source terminals are "tied" to the negative power supply bus $V_{ss}$. Another approach uses a field FET, which is a field effect transistor having both gate and drain terminals connected to the input pad, and having its source terminal connected to $V_{ss}$. Although both the grounded gate FET and the field FET eliminated the leakage path to $V_{DD}$, ESD performance was unsatisfactory. In particular, due to the use of silicided diffusions, uniform current flow, and thus consistent ESD results were difficult to ensure in these types of structures because they rely on a so-called snapback mechanism to dissipate discharge. A third approach proposed in the art employs a so-called diode stack; that is, several series-connected diodes (e.g., five) substituted for the single diode $D_2$. This approach has also proven unsatisfactory under worst-case conditions, insofar as the input leakage current was found to be unacceptably large. This large current was due to Darlington amplification resulting from the parasitic PNP bipolar transistors formed by each of the diodes in the stack between the input pad and the positive power supply bus $V_{DD}$.

Accordingly, there is a need to provide an improved ESD protection circuit suitable for use in an integrated circuit, that minimizes or eliminates one or more of the problems as set forth above.

SUMMARY OF THE INVENTION

It is an object of the present invention to provide protection against electrostatic discharge (ESD) on input pins of an integrated circuit. It is a further object of the present invention to provide a protection circuit against electrostatic discharge (ESD) on input pins that allows the voltage on the input pins to exceed the positive power supply voltage of the integrated circuit during normal operation without resulting in any significant input leakage current.

To achieve these and other objects, and in accordance with the present invention, an apparatus for protecting a semiconductor device from ESD events is provided and which includes two major portions: an electrostatic discharge (ESD) bus, and an ESD protection circuit. The ESD bus is coupled to an input pad of the device using a diode. The ESD bus is isolated from the positive power supply bus ($V_{DD}$) associated with the device.

The ESD protection circuit includes an SCR circuit and a field effect transistor (FET) for controlling the SCR circuit. The SCR circuit is coupled between the ESD bus and the negative power supply bus ($V_{ss}$). The SCR circuit is normally in a high-impedance, "OFF" state for isolating the ESD bus from the negative power supply bus to thereby substantially reduce or eliminate externally-sourced leakage currents into the input pad. The FET is responsive to the voltage on the ESD bus for triggering the SCR circuit into a low-impedance, "ON" state when the voltage of the ESD bus reaches a predetermined threshold level. This threshold voltage is higher than the positive power supply bus voltage $V_{DD}$ and, further, higher than voltage levels expected to be encountered on the input pads. Thus, the ESD protection circuit is designed so that it does not have any leakage current if the voltage on the ESD bus exceeds the voltage on the $V_{DD}$ bus during normal operation.

In a preferred embodiment, the protection apparatus further includes a minimum-level limiting circuit for limiting the voltage on the ESD bus so as to not be below a predetermined minimum level, and further includes a maximum-level limiting circuit for limiting the voltage on said ESD bus to a predetermined maximum level. The minimum-level limiting circuit reduces transient currents, and thus reduces the input capacitance as seen from the input pad. The maximum-level limiting circuit provides a structure for shunting from the ESD bus accumulated charge that may cause undesirable triggering of the SCR circuits, and which may result in either a non-destructive functional failure, or a permanent destructive failure.

Other objects, features, and advantages of the present invention will become apparent to one skilled in the art from the following detailed description and accompanying drawings illustrating features of this invention by way of example, but not by way of limitation.

DETAILED DESCRIPTION OF THE PREFERRED EMBODIMENTS

Figure 1:
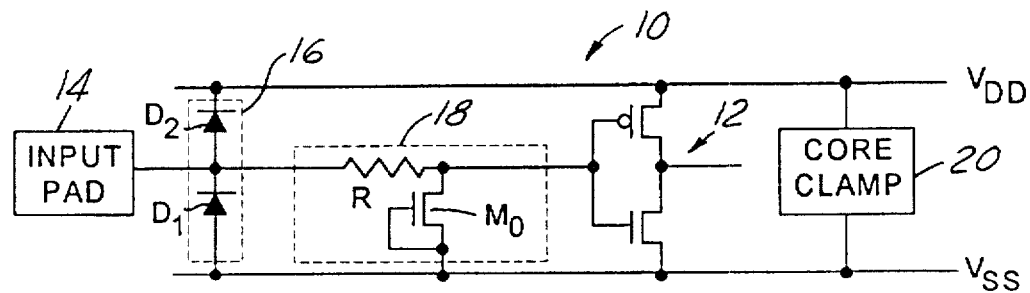
FIG. 1 is a simplified schematic drawing of protection circuitry employed in the prior art.
Figure 2:
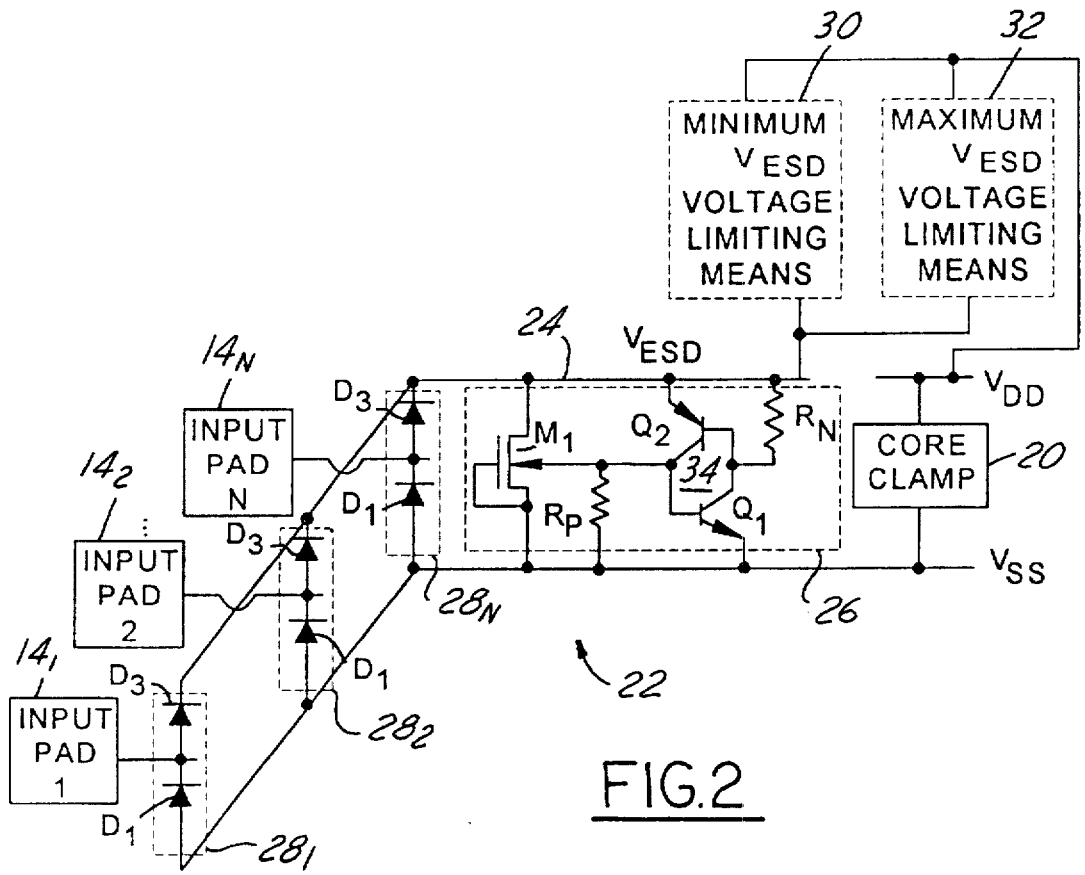
FIG. 2 is a simplified equivalent circuit schematic and block diagram view of one embodiment of the invention.

Referring now to the drawings wherein like reference numerals are used to identify identical components in the various views FIG. 2 shows an apparatus 22 for protecting a semiconductor device from electrostatic discharge (ESD) events. Apparatus 22 is adapted for use in connection with a plurality of input pads, such as input pads $14_1$, $14_2$, ... $14_N$. It should be understood that each of the input pads $14_1$, $14_2$, ... $14_N$ are still connected to a secondary ESD protection circuit, such as circuit 18 shown in FIG. 1, and, further still connected to an input buffer, such as input buffer 12, also shown in FIG. 1, although circuits 12, and 18 are not shown in FIG. 2. The positive power supply bus for the integrated circuit, designated $V_{DD}$, is protected against ESD with respect to the negative power supply bus of the integrated circuit, $V_{ss}$, and vice-versa, using a core clamp 20. Core clamp 20 is conventional in the art and will not be further addressed.

Apparatus 22 includes an electrostatic discharge (ESD) bus 24, designated $V_{ESD}$, an ESD protection circuit, such as FET-triggered silicon controlled rectifier (SCR) circuit 26, a plurality of diode clamping circuits 28, such as circuits $28_1$, $28_2$, ... $28_N$, means, such as circuit 30, for limiting a voltage potential of bus 24 to a predetermined minimum level, and means, such as circuit 32, for limiting the voltage potential of bus 24 to a predetermined maximum level.

A first plurality of diodes $D_1$ are coupled between the negative power supply bus $V_{ss}$ and a respective one of the plurality of input pads $14_1$, $14_2$, ... $14_N$. As shown in FIG. 2, the orientation of the plurality of diodes $D_1$ (i.e., anode connected to $V_{ss}$ and cathode connected to the input pad) is such that a negative polarity ESD event is clamped to within one diode drop of $V_{ss}$. This technique is the same as employed in conventional protection circuitry, such as protection circuitry 10 shown in FIG. 1. Further, each input pad $14_1$, $14_2$, ... $14_N$ is connected to the $V_{ESD}$ bus 24 by a respective one of a second plurality of diodes $D_3$. Diodes $D_3$ are provided for shunting charge from positive polarity ESD events on a respective one of the input pads $14_1$, $14_2$, ... $14_N$ to the $V_{ESD}$ bus 24.

In one embodiment of the present invention, particularly one that does not include circuits 30, and 32 the $V_{ESD}$ bus 24 is isolated from the positive power supply bus $V_{DD}$. The $V_{ESD}$ bus 24 may be formed in a semiconductor device using a variety of conductive materials; however, in a preferred embodiment, metal is used to form the $V_{ESD}$ bus 24.

Protection circuit 26 is connected between the $V_{ESD}$ bus 24 and the negative power supply bus $V_{ss}$ of the device to be protected and is provided for isolating the $V_{ESD}$ bus 24 from the negative power supply $V_{ss}$ when in a first, high-impedance, "OFF" state to thereby reduce externally-sourced leakage currents into input pads $14_1$, $14_2$, ... $14_N$ (i.e., as through a respective diode $D_3$, to $V_{ESD}$ bus 24, and to ground or $V_{DD}$). Circuit 26 is further provided for transferring charge from the $V_{ESD}$ bus 24 to the negative power supply bus $V_{ss}$ when in a second, low-impedance "ON" state. Circuit 26 further includes means for transitioning from the first state to the second state when a voltage potential of the $V_{ESD}$ bus 24 reaches a predetermined threshold level. Through the above-described functionality, the protection circuit 26 provides for the elimination, or at least a substantial reduction in, leakage current during normal operation, with maintaining the capability of shunting destructively large ESD charges to ground when a predetermined threshold level appears on the $V_{ESD}$ bus 24 (i.e., from input pad via diode $D_3$). In particular, the predetermined threshold level is selected to be higher than the voltage level of the positive power supply bus ($V_{DD}$), and, further, selected to be higher than the highest normal operating voltage expected to be encountered at the input pads.

Thus, although any structure meeting the above-identified functional specifications is within the spirit and scope of the present invention, in the preferred embodiment shown in FIG. 2, the ESD protection circuit is a FET-triggered silicon controlled rectifier (SCR) circuit 26, which includes an SCR circuit 34 and a field effect transistor $M_1$ for controlling the SCR circuit 34. In particular, SCR circuit 34 is represented in FIG. 2 by an equivalent electrical circuit diagram including an NPN bipolar junction transistor $Q_1$, and PNP bipolar junction transistor $Q_2$ that are interconnected so that each receives base current from the collector terminal of the other. When either transistor is turned-on, it supplies base current to the other. Thus, SCR circuit 34 latches up with both transistors turned-on after either of the transistors is initially turned-on. The two transistors turn-off when the current is interrupted in either transistor.

A more complete understanding of FET-triggered SCR circuit 26 as employed in a preferred embodiment, may be had from a discussion of the semiconductor structure used for its implementation. Accordingly, reference is now made to FIG. 3, which shows a semiconductor structure corresponding to the FET-triggered SCR circuit 26, in cross-sectional, simplified, and exaggerated form for purposes of illustration.

The semiconductor structure corresponding to circuit 26 includes a substrate of a first conductivity type, such as P-type silicon substrate 36, a first ohmic contact of the first conductivity type, such as $P^+$ diffusion 38 formed in substrate 36, a drain region of a second conductivity type opposite the first conductivity, such as $N^+$ diffusion region 40 formed in substrate 36, a source region of the second conductivity type, such as $N^+$ diffusion region 42 formed in the substrate, a channel region 44 defined in the substrate between spaced apart drain 40 and source 42 regions, a well region of the second conductivity type, such as N-well 46 formed in substrate 36, a second ohmic contact region of the second conductivity type, such as $N^+$ diffusion region 48 formed in N-well 46, a junction region of the first conductivity type, such as $P^+$ diffusion region 50 formed in well 46, a layer of dielectric material 52 disposed over substrate 36, and a control gate 54 formed over layer 52.

Layer 52 includes a gate dielectric region overlying channel 44. Control gate 54 includes a portion overlying channel 44. First ohmic contact 38, control gate 54, and source region 52 are connected to the negative power supply bus $V_{ss}$. The $V_{ESD}$ bus 24 is connected to drain region 40, junction region 50, and second ohmic contact region 48.

Figure 3:
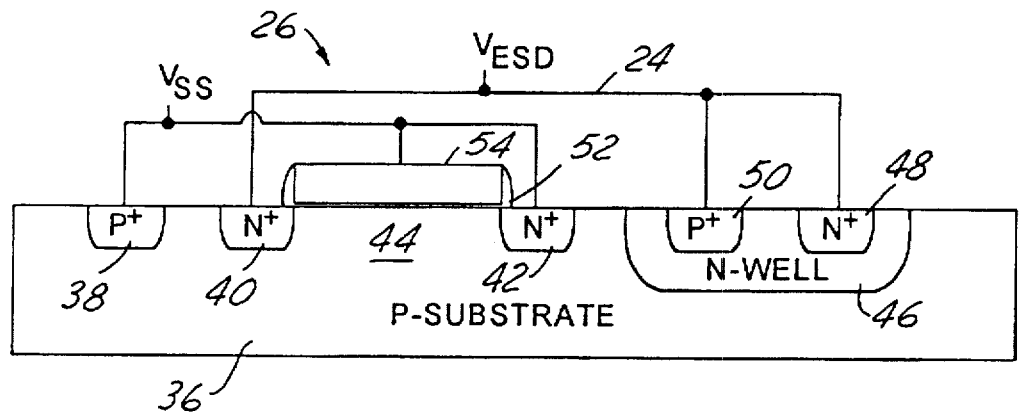
FIG. 3 is a simplified, exaggerated cross-sectional view of a semiconductor structure corresponding to the protection circuit in FIG. 2.

It should be appreciated that the structure shown in FIG. 3 is diagrammatic and exaggerated for ease of illustration. It should further be appreciated that the variations in donor/acceptor impurities, and concentrations of same to fabricate the structure shown in FIG. 3 are many in number and are within the reach of one of ordinary skill in the art. However, in a constructed embodiment, the structure shown in FIG. 3 is particularly used in connection with a static RAM (SRAM) device having an operating voltage of $V_{DD}$=3.3 V, and that must withstand applications of 5.0 V (nominal) on certain input pads with low leakage current.

The P-type conductivity substrate 36 is typically relatively lightly doped (about $2.5 \times 10^{14}$ cm$^{-3}$) and has a relatively low degree of conductivity. The $P^+$ regions 38 and 50 are relatively heavily doped (about $1.0 \times 10^{20}$ cm$^{-3}$) and of relatively high conductivity. The $N^+$ conductivity type region (i.e., drain region 40/source region 42/region 48) are relatively heavily doped, typically about $1.5 \times 10^{20}$ cm$^{-3}$, and have relatively high conductivity. The N-well 46 is relatively lightly doped, typically about $2.0 \times 10^{17}$ cm$^{-3}$, and has a relatively low degree of conductivity. Dielectric material 52 may be silicon dioxide material, wherein the gate dielectric region overlying channel 44 may have a thickness in the range of 135–155 Å, and is preferably about 145 Å thick. Control gate 54 may comprise polycrystalline silicon ("poly") material having a thickness in the range of 2250–2750 Å, and is preferably about 2500 Å thick.

Referring to FIGS. 2, and 3, FET $M_1$ is formed by way of drain region 40, channel 44, source region 42, gate oxide 52, and control gate 54. NPN bipolar transistor $Q_1$ is formed by source region 42 (emitter), P-substrate 36 (base), and N-well 46 (collector). PNP bipolar transistor $Q_2$ is formed by $P^+$ diffusion 50 (emitter), N-well 46 (base), and P-substrate 36 (collector).

With continued reference to FIGS. 2 and 3, a description of the operation of apparatus 22 will now be set forth in detail.

When a device employing the present invention is powered-up, the $V_{ESD}$ bus 24 is essentially at 0 V. Protection circuit 26, particularly SCR circuit 34, is initially in a first, high-impedance "OFF" state. In this first state, voltages applied to input pads $14_1$, $14_2$, ... $14_N$, that are in excess of $V_{DD}$ will not cause large leakage currents to be drawn, but rather, will at most cause transient currents to flow through diode $D_3$ to charge $V_{ESD}$ bus 24 to a voltage level one diode drop below the excessive voltage level being applied (see below for disclosure of further embodiments that particularly address the transient current phenomena). Subsequent applications of voltages higher than $V_{DD}$ (e.g., 5.0 V when $V_{DD}$=3.3 V), will incur substantially no leakage currents. Controlled application of voltages, even in excess of $V_{DD}$, to input pins of a device in this context would be considered "normal" operation. However, ESD events are not considered part of "normal" operation.

For a negative polarity ESD event (hereinafter "ZAP"), diodes $D_1$ forward bias and shunt the charge between the input pad subject to the ESD ZAP (i.e., one or more of input pads $14_1$, $14_2$, ... $14_N$) and the $V_{ss}$ bus. Moreover, ESD charge may be transferred from the $V_{ss}$ bus to the $V_{DD}$ bus, through core clamp 20, if the ESD ZAP is referenced to the $V_{DD}$ bus. Generally, the operation of the embodiment in accordance with the present invention, for a negative ESD ZAP, is identical to conventional methods.

For a positive ESD ZAP on one or more of the input pads $14_1$, $14_2$, ... $14_N$, respective diodes $D_3$ become forward biased and shunt the charge from the corresponding input pad $14_1$, $14_2$, ... $14_N$, to the $V_{ESD}$ bus 24. As charge is transferred onto $V_{ESD}$ bus 24, a voltage potential associated with bus 24 increases, with respect to $V_{ss}$, until the junction formed by the $N^+$ drain region 40, and the P-substrate 36 (i.e., an np junction) breaks down under high reverse bias voltage. In the preferred embodiment, based on the fabrication details discussed above, this threshold occurs when about 12.3 V is applied across the $N^+$ junction and the P-substrate 36.

This breakdown condition injects holes into substrate 36, and causes FET $M_1$ to snapback. In the snapback mode, FET $M_1$ operates as a lateral NPN bipolar transistor, with base current being supplied by holes generated by impact ionization at the drain end (i.e., region 40) of channel 44. Once FET $M_1$ snaps back, the voltage between the $N^+$ drain junction 40, and the $N^+$ source 42 is reduced to about 9.0 V, again, based on the foregoing fabrication details.

The holes that are generated by FET $M_1$ in snapback causes a corresponding voltage drop across P-substrate resistance $R_p$, which turns on NPN bipolar transistor $Q_1$. When transistor $Q_1$ turns on, current flows through N-well resistance $R_N$. The voltage drop which is thereby created across the equivalent resistance $R_N$ turns on PNP bipolar transistor $Q_2$. When transistor $Q_2$ turns on, it supplies base current to transistor $Q_1$, thus creating a feedback loop.

As a result of this current feedback, the SCR circuit 34 formed by transistors $Q_1$ and $Q_2$, "latches up" into a low-impedance "ON" state. In effect, then, FET $M_1$ is responsive to the voltage on the $V_{ESD}$ bus 24 to place SCR circuit 34 in the low-impedance state when the threshold voltage 12.3 V is reached or, in other words, FET $M_1$ provides the means for transitioning to the low-impedance state.

This low-impedance state is characterized by a voltage drop of about 1.4 V between the $V_{ESD}$ bus 24, and the negative power supply bus $V_{ss}$. The SCR circuit 34 will remain in the low-impedance state until current is interrupted; i.e., until all of the charge from the ESD ZAP is transferred from $V_{ESD}$ bus 24 to the $V_{ss}$ bus. Once the charge transfer is complete, the FET-triggered SCR circuit 26, particularly SCR 34, returns to a high-impedance "OFF" state. Positive ESD ZAP's, referenced to the positive power supply bus $V_{DD}$ can be transferred from the $V_{ss}$ bus to the $V_{DD}$ bus through core clamp 20.

In view of the foregoing, it should be appreciated that without regard to the voltage of the positive power supply bus $V_{DD}$, the voltage on the input pad can go as high as the FET $M_1$ $N^+$ drain junction breakdown voltage, plus one diode drop (i.e., for $D_3$), with very small leakage current. Based on the foregoing fabrication details for the constructed embodiment, a maximum allowed voltage on the input pad would be 13.0 V. At this threshold level, the above-described breakdown occurs, thus triggering the SCR circuit 34. Of course, ESD events will likely be higher than this level, thus triggering circuit 26 into the low-impedance protection state. However, for a variety of applications, other than ESD events, where input voltages on the input pad exceed the positive power supply operating voltage $V_{DD}$, very low leakage levels can be obtained.

The foregoing describes one embodiment of the present invention. However, further embodiments of the present invention will now be set forth embodying improvements upon the basic invention, and are directed, generally, to controlling the voltage on the $V_{ESD}$ bus 24 during normal operation. As shown in FIG. 2, a second embodiment includes circuit 30 for limiting or ensuring that the voltage of the $V_{ESD}$ bus 24 is maintained at a predetermined minimum level. A third embodiment includes circuit 32 for limiting the voltage on the $V_{ESD}$ bus 24 to a maximum predetermined level. A fourth embodiment includes both circuits 30, and 32.

Figure 4A:
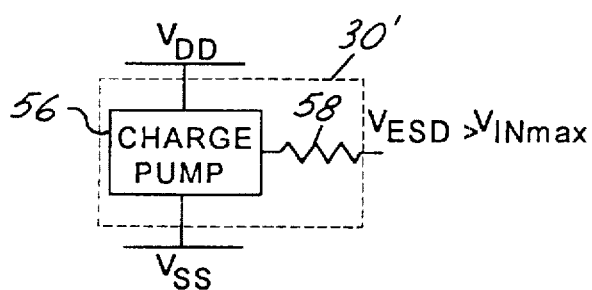
FIGS. 4A–4C show alternate minimum voltage level limiting structures that may be used in connection with the embodiment shown in FIG. 2.
Figure 4B:
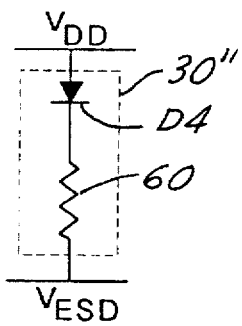
Figure 4C:
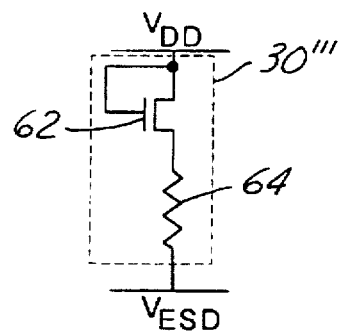

Referring now to FIGS. 4A–4C, three structures are illustrated for implementing circuit 30: 30', 30", and 30'". As background, in the first embodiment described above, the $V_{ESD}$ bus 24 is essentially floating when the input pad voltages are at or below the voltage potential of the $V_{ESD}$ bus; accordingly, leakage currents between the $V_{ESD}$ bus 24, and the power supply buses $V_{DD}$, $V_{ss}$, or input pads $14_1$, $14_2$, ... $14_N$, should be very small. However, when the integrated circuit is powered up, the voltage on $V_{ESD}$ bus 24 should be close to 0 V. When any of the input pads $14_1$, $14_2$, ... $14_N$, rises above the voltage of $V_{ESD}$ bus 24 by about 0.7 V (i.e., a forward-biased diode voltage drop of diode $D_3$), diode $D_3$ between a respective input pad $14_1$, $14_2$, ... $14_N$, and $V_{ESD}$ bus 24 will forward bias, and cause current to flow from the input pad to $V_{ESD}$ bus 24. This current will charge up the $V_{ESD}$ bus, and, when the voltage on the $V_{ESD}$ bus 24 rises to about 0.7 V below the input pad voltage, diode $D_3$ will turn-off, and current flow will be discontinued.

This transient current is equivalent to having an additional transient input capacitance whenever the input pad voltage rises more than about 0.7 V above the voltage of the $V_{ESD}$ bus 24. Furthermore, since diode $D_3$ contains a parasitic PNP bipolar transistor, the capacitance of $V_{ESD}$ bus 24 is amplified, and appears as an input capacitance on any one of the input pads $14_1$, $14_2$, ... $14_N$, whose voltage rises high enough to forward bias the respective diode $D_3$ to the $V_{ESD}$ bus 24. It should be appreciated that the transient capacitance persists only for the duration of the transient current.

The additional input capacitance can be reduced, or even substantially eliminated by limiting the minimum voltage on the $V_{ESD}$ bus 24 using one of the structures 30', 30", and 30'". Stated another way, by ensuring that the voltage of the $V_{ESD}$ bus 24 is always at least a certain value, transient currents, and thus input capacitance, can be eliminated.

Referring particularly to FIG. 4A, structure 30' includes a charge pump structure 56, and a resistor 58. Charge pump 56 is conventional in the art, and may be used to set the voltage of $V_{ESD}$ bus 24 to a level high enough such that diode $D_3$ connected between one of the input pads 14 to the $V_{ESD}$ bus 24 will never forward bias in normal operation, even under worst case conditions. In particular, charge pump 56 permits setting the voltage of $V_{ESD}$ bus 24 higher than the positive power supply voltage $V_{DD}$. For example, $V_{DD}$ may be 3.3 V, but an input voltage $V_{inmax}$ may be 5.0 V (nominal). Using structure 30', the voltage of bus $V_{ESD}$ bus 24 may be set to, for example, 5.5 V. This configuration would ensure that none of the diodes $D_3$ would be forward biased under normal operating conditions. However, charge pump 56 consumes power, which may be unacceptable for low standby current-type products. Resistor 58 may be included to prevent ESD damage to charge pump 56.

Referring particularly to FIG. 4B, structure 30" includes diode $D_4$, connected in series with resistive element 60. Structure 30" maintains the voltage on the VESD bus 24 at a level no more than a forward-biased diode voltage drop below the voltage on the positive power supply bus $V_{DD}$. In effect, structure 30" provides a clamping configuration that ensures that no additional input capacitance is seen at an input pad $14_i$ as long the input voltage on the input pad does not exceed $V_{DD}$. Again, resistor 60 is provided to protect against ESD events.

Referring particularly to FIG. 4C, structure 30'" includes an NMOS transistor 62, connected as a diode, in series with a resistive element 64. Structure 30'" is similar to structure 30", insofar as it maintains the voltage of $V_{ESD}$ bus 24 at a level no more than one threshold voltage $V_T$ below $V_{DD}$. The threshold voltage $V_T$ is generally a higher value than the voltage drop across diode $D_4$. Resistor 64 is used for protection against ESD events. In a constructed embodiment, structure 30" is used as a means for limiting the voltage of $V_{ESD}$ bus 24 to a predetermined minimum level during normal operation to thereby reduce the effective input capacitance at the input pads $14_1$, $14_2$, ... $14_N$.

In yet another embodiment, the maximum voltage of the $V_{ESD}$ bus is limited to a predetermined maximum level during normal operation by inclusion of circuit 32 to prevent undesired triggering of SCR circuit 34. In particular, as mentioned above, since $V_{ESD}$ bus 24 is essentially floating, it is possible that it could be pumped up to a fairly high voltage during normal operation, for example, by noise on the input pins. Whenever an input pin voltage rises more than about 0.7 V above $V_{ESD}$, diode $D_3$ will forward bias and transfer charge to $V_{ESD}$ bus 24. The voltage on the $V_{ESD}$ bus 24 will rise until diode $D_3$ turns off. Alternately, the voltage on $V_{ESD}$ bus 24 can also be increased by capacitive coupling between input pads $14_1$, $14_2$, ... $14_N$ and $V_{ESD}$ bus 24 through a respective diode $D_3$. If the voltage on bus 24 becomes too large, FET $M_1$ may trigger SCR circuit 34, during normal operation, and cause either a non-destructive functional failure (i.e., bring down the voltage on a pin to such a level that a logic operation is incorrectly carried out), or, a permanent destructive failure (i.e., if a low-impedance source, such as a DC power supply, is coupled to an input then high currents may damage the device).

Figure 5:
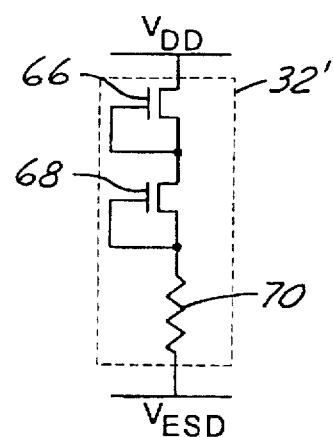
FIG. 5 shows a maximum voltage level limiting structure that may be used in connection with the embodiment shown in FIG. 2.

FIG. 5 illustrates structure 32' for implementing circuit 32 shown in FIG. 2. Structure 32 includes a pair of diode-connected NMOS transistors 66, 68 connected in series, with a resistive element 70, between $V_{DD}$ and $V_{ESD}$ such that the voltage on the $V_{ESD}$ bus 24 can only rise above the voltage of the positive power supply bus $V_{DD}$ by the sum of the threshold voltages of the series-connected NMOS FETs 66, and 68. Once this threshold level (i.e., $2*V_T$) is passed, the FETs 66, and 68 will turn-on, and thereby limit the voltage on the $V_{ESD}$ bus 24. It should be appreciated that NMOS FETs 66, and 68 have a source-to-substrate voltage that will increase their threshold voltage. The number of series-connected FETs may be selected to allow the input pads to rise as high as desired without turning on the FETs, and thereby causing input leakage currents. In the constructed embodiment, two NMOS FETs, 66, and 68, were selected to allow input pad voltages to be 5.5 V, when $V_{DD}$ is 3.0 V, under worst case temperature conditions of 155° C., and still meet input leakage requirements. Resistor 70, of course, may be included to prevent ESD damage to FETs 66, and 68.

It should be appreciated that structures 30', 30", 30'", and 32' have been designed for low current during ESD events—the SCR circuit 34 designed to shunt most of the ESD charge. The low current can be obtained by inserting a series resistance (as illustrated), or by design of the components.

An apparatus for protecting a semiconductor device, in accordance with the present invention, permits effective dissipation of ESD events under a variety of fabrication processes, while providing for extremely low input leakage currents for input voltages that are above the operating voltage of the chip, but are within the normal voltages of a mixed-voltage environment (e.g., $V_{DD}$=3.3 V while input voltages equal 5.0 V). Alternate embodiments that include structures for limiting minimum and maximum voltages on an ESD bus have extremely low input pin capacitance values, and are extremely stable (i.e., no undesired triggering of the ESD protection circuit—SCR circuit).

While the invention has been particularly shown and described with reference to the preferred embodiments thereof, it is well understood by those skilled in the art that various changes and modifications can be made in the invention without departing from the spirit and scope of the invention. For example, the invention disclosed herein may be used for ESD protection of output pins, input/output (I/O) pins, as well as for input-only pins of an integrated circuit. Generally, interface pads may be used to refer to input, output, and/or combination input/output (I/O) pads.

We claim:

1. An apparatus for protecting a semiconductor device from electrostatic discharge (ESD) events wherein the device includes a plurality of interface pads, a positive power supply bus ($V_{DD}$), and a negative power supply bus ($V_s$), comprising:

one or more first diodes coupled between the negative power supply bus and said plurality of interface pads;
an ESD bus isolated from said positive power supply bus;
one or more second diodes coupled between said interface pads and said ESD bus, said one or more second diodes being operative to transfer charge from said interface pads to said ESD bus;
an ESD protection circuit including an SCR circuit and a first field effect transistor (FET) for controlling said SCR circuit, said SCR circuit being coupled between said ESD bus and said negative power supply bus, said SCR circuit having a high-impedance off state for isolating said ESD bus from said negative power supply bus to thereby reduce externally-sourced leakage currents into said interface pads, said first FET being responsive to a voltage potential of said ESD bus for placing said SCR circuit in a low-impedance on state when said voltage potential reaches a predetermined threshold level wherein said predetermined threshold level is higher than a voltage potential of said positive power supply bus and further higher than voltage levels normally encountered on said interface pads whereby input leakage currents are reduced when voltage potentials higher than said positive power supply bus level are applied to said interface pads.

2. The apparatus of claim 1 wherein said first diode includes an anode and a cathode wherein said interface pad is connected to said anode.

3. The apparatus of claim 1 wherein said SCR circuit is coupled to transfer charge from said ESD bus to said negative power supply bus.

4. The apparatus of claim 1 wherein a plurality of first diodes are coupled between the negative power supply bus and a respective one of said plurality of interface pads and a plurality of second diodes are coupled between a respective one of said interface pads and said ESD bus.

5. The apparatus of claim 1 further including means coupled between said ESD bus and said positive power supply bus ($V_{DD}$) for limiting said voltage potential of said ESD bus to a predetermined maximum level during normal operation to thereby prevent said ESD protection means from transitioning to said low impedance on state.

6. The apparatus of claim 5 where said maximum level limiting means includes at least a second field effect transistor (FET) having gate, source, and drain terminals, connected in series with a resistive element, said drain terminal being connected to said positive power supply bus ($V_{DD}$), said gate and source terminals being coupled to a common node, said resistive element being coupled to said ESD bus to thereby form a clamping configuration.

7. The apparatus of claim 1 further including a minimum-level limiting circuit for limiting said voltage potential of said ESD bus to a predetermined minimum level comprising a third diode having a cathode and anode terminals, connected in series with a first resistive element, said anode terminal being connected to said positive power supply bus ($V_{DD}$), and said first resistive element being coupled between said ESD bus and said cathode terminal, said apparatus further including a maximum-level limiting circuit for limiting said voltage potential of said ESD bus to a predetermined maximum level comprising a second FET and a third FET each having respective gate, source, and drain terminals connected in series with a resistive element, said drain terminal of said second FET being connected to said positive power supply bus ($V_{DD}$), said gate and source terminals being coupled to the drain of said third FET, said gate and source terminals being coupled to a common node, said resistive element being coupled between said common node and said ESD bus.

8. The apparatus of claim 7 wherein said second diode comprises a base-emitter junction of a parasitic pnp bipolar transistor.

9. The apparatus of claim 1 further including means coupled between said ESD bus and said positive power supply bus ($V_{DD}$) for limiting said voltage potential of said ESD bus to a predetermined minimum level during normal operation to thereby reduce an effective input capacitance seen by said interface pads.

10. The apparatus of claim 9 wherein said minimum level limiting means includes a charge pump structure further coupled to said negative power supply bus.

11. The apparatus of claim 9 wherein said minimum level limiting means includes a second field effect transistor (FET) having gate, drain, and source terminals, connected in series with a resistive element, said gate and drain terminals being connected to said positive power supply bus ($V_{DD}$), and said resistive element being coupled between said ESD bus and said source terminal to thereby form a clamping configuration.

12. The apparatus of claim 9 wherein said minimum level limiting means includes a third diode having an anode and cathode connected in series with a resistive element wherein said anode is connected to said positive power supply bus ($V_{DD}$) and said resistive element is connected between said ESD bus and said cathode to thereby form a clamping configuration.

13. The apparatus of claim 12 wherein said second diode comprises a base-emitter junction of a parasitic pnp bipolar transistor.

* * * * *